(12) United States Patent
Kadlec et al.

(10) Patent No.: US 9,611,537 B2
(45) Date of Patent: Apr. 4, 2017

(54) TARGET SHAPING

(75) Inventors: Stanislav Kadlec, Prague (CZ); Jürgen Weichart, Balzers (LI)

(73) Assignee: EVATEC AG, Trubbach (CH)

( * ) Notice: Subject to any disclaimer, the term of this patent is extended or adjusted under 35 U.S.C. 154(b) by 1333 days.

(21) Appl. No.: 13/032,922

(22) Filed: Feb. 23, 2011

(65) Prior Publication Data

US 2011/0203920 A1    Aug. 25, 2011

Related U.S. Application Data

(60) Provisional application No. 61/307,077, filed on Feb. 23, 2010.

(51) Int. Cl.
*C23C 14/00* (2006.01)
*C23C 14/34* (2006.01)

(52) U.S. Cl.
CPC ................. *C23C 14/3407* (2013.01)

(58) Field of Classification Search
None
See application file for complete search history.

(56) References Cited

U.S. PATENT DOCUMENTS

| | | | |
|---|---|---|---|
| 4,842,703 A | 6/1989 | Class et al. | |
| 5,009,765 A | 4/1991 | Qamar et al. | |
| 5,126,029 A * | 6/1992 | Tomer et al. | 204/192.12 |
| 5,190,630 A | 3/1993 | Kikuchi et al. | |
| 5,688,381 A | 11/1997 | Gruenenfleder et al. | |
| 5,914,018 A | 6/1999 | Fu et al. | |
| 7,569,123 B1 * | 8/2009 | Juliano et al. | 204/192.13 |
| 2003/0178301 A1 * | 9/2003 | Lynn et al. | 204/298.12 |

* cited by examiner

*Primary Examiner* — Keith Hendricks
*Assistant Examiner* — Timon Wanga
(74) *Attorney, Agent, or Firm* — Pearne & Gordon LLP

(57) ABSTRACT

A target for a physical vapor deposition system includes a top, a bottom, and a base. The base essentially is defined by the surface of the target to be sputtered. A first, inner ring and a second, outer ring extend from the base. Each ring has an inner side and an outer side, wherein sputtering is concentrated on the outer sides by means of a magnet arrangement adjacent to the target.

10 Claims, 14 Drawing Sheets

| Target radius | Target surface height |
|---|---|
| 0 | 0 |
| 147.5 | 0 |
| 150 | -0.5 |
| 152.5 | -1.5 |
| 155 | -2.5 |
| 157.5 | -3.5 |
| 160 | -4.5 |
| 162.5 | -5.5 |
| 165 | -6.5 |
| 167.5 | -7 |
| 170 | -7.25 |
| 172.5 | -7.5 |
| 175 | -7.75 |
| 177.5 | -8 |
| 180 | -8.25 |
| 182.5 | -8.5 |
| 185 | -8.75 |
| 187.5 | -9 |
| 190 | -9.25 |
| 192.5 | -9.5 |
| 195 | -9.75 |
| 197.5 | -10 |
| 200 | -10 |

FIG. 7d

TARGET SHAPING

This application claims the benefit of U.S. provisional patent application Ser. No. 61/307,077 filed Feb. 23, 2010, the contents of which are incorporated herein by reference in their entirety.

BACKGROUND OF THE INVENTION

Field of Invention

The present invention relates to a physical vapor deposition (PVD) target. In particular, it relates to a target that is shaped like a truncated cone, a dome, or a Fresnel lens.

Discussion of Prior Art

Sputter deposition is a physical vapor deposition (PVD) method of depositing thin films by ejecting or "sputtering" material from a target onto a substrate, such as a silicon wafer.

Sputter coating apparatuses are generally known. In a typical apparatus, an energy discharge is used to excite atoms of an inert gas, e.g. argon, to form an ionized gas or plasma. Charged particles (electrons) from the plasma are accelerated toward the surface of a sputter target by application of a magnetic field. The sputter target typically is provided in the form of a rectangular slab, sheet, or plate. The plasma bombards the surface of the target, thus eroding that surface and liberating target material. The liberated target material then can be deposited onto a substrate, such as metal, plastic, glass, or a silicon wafer, to provide a thin-film coating of the target material on the substrate.

Sputtering sources can be magnetrons that utilize strong electric and magnetic fields to trap electrons close to the magnetron surface or target. These magnetic fields can be generated by an array of permanent magnets arranged behind the target, thus establishing a magnetic tunnel above the target surface. The electrons are forced to follow helical paths caused by the electric and magnetic fields and undergo more ionizing collisions with gaseous neutrals near the target surface than would otherwise occur. This results in a closed plasma loop during operation of the magnetron. At the location of the plasma loop on the surface of the target, a "racetrack" groove is formed, which is the area of preferred erosion of material. In order to increase material utilization, it is known in the prior art to use movable magnetic arrangements to sweep the plasma loop over larger areas of the target.

In order to decrease the racetrack groove formation and achieve more efficient utilization of the target, non-flat targets are known in the prior art. In general, it is a well known practice to increase the target thickness in the regions of main erosion. For example, U.S. Pat. No. 4,842,703 to Class et al. and U.S. Pat. No. 5,688,381 to Grünenfelder et al. disclose targets with a concave surface.

Several PVD applications require using a long distance between the target and the substrate. This is known as long target-to-substance distance (TSD) sputtering. Long TSD sputtering narrows the angular profile of the material sputtered from the target, making the sputtered material easier to direct. Long TSD sputtering is required in order to produce layers of film with low sidewall coverage, such as to enable lift-off processing or to avoid unwanted fencing of sidewall material when a photo resist is removed.

A disadvantage of a long target-to-substrate distance (TSD) is the resulting poor uniformity of the deposited material on the substrate. This effect can typically only be compensated by increasing the diameter of the target. However, increasing the diameter of the target can be burdensome and impractical. For example, if the substrate is a 300 mm wafer, a very big and uneconomic target size would be required.

Another disadvantage of long TSD sputtering is a dramatically reduced sputtering rate. In addition, because gas is scattering over an increased distance, the effect of narrowing the angular distribution is alleviated. In fact, the effect of directional sputtering almost disappears at realistic pressures of 1-2 mTorr, even at target-to-substrate distances as low as 150 mm.

FIGS. 1 to 5 illustrate the aforementioned issues with current sputtering targets. In particular, FIG. 1 illustrates a sputtering erosion profile of at a prior art target. In the graph of FIG. 1, the Y-variable is percent erosion of the target center area, and the X-variable is target radius at a point on the target in cm. The calculations are based on a target diameter of 400 mm and a substrate diameter of 300 mm at varying target substrate distances. The center of the target has a percent erosion of 10%. At a target radius between 10 and 15 cm, the percent erosion begins to increase until it eventually reaches 100%. This increased erosion represents the racetrack groove. FIG. 1 shows that while the material around the racetrack groove is completed eroded, plenty of useful material remains near the target center.

For the erosion profile of FIG. 1, FIG. 2 plots uniformity of the layer deposited on the substrate for target-to-substrate distances (TSDs) from 120 mm to 800 mm. The Y-variable is percent uniformity of the layer on the substrate, and the X-variable is substrate radius in mm. The graph of FIG. 2 shows that the flattest, and therefore most ideal, deposition profile is achieved for a TSD of 150 mm. For lower distances, such as 120 mm, the profile has a concave shape. For higher distances, such as 175 mm, 200 mm, 300 mm, 400 mm, or 500 mm, the profile gets convex. However for very long distances, such as 800 mm, the convexity decreases since the target can be seen more and more as a point source.

In FIG. 3, the behavior of FIG. 2 is plotted as function of TSD. The Y-variable is percent surface fluctuation of the deposited layer on the substrate, and the X-variable is TSD in mm. Similar to FIG. 2, FIG. 3 indicates the best uniformity around a TSD of 150 mm.

FIG. 4 depicts sputtering efficiency based on the same conditions as FIGS. 1-3. In FIG. 4, the Y-variable is percent deposition efficiency, and the X-variable is TSD in mm. As the TSD increases, the deposition efficiency decreases.

It should be appreciated that these calculations have been done for very low pressures of 0.1 mTorr. When the pressure is increased, which may be necessary to sustain stable plasma, the uniformity gets much worse. FIG. 5 depicts this pressure effect on uniformity for a TSD of 500 mm. The Y-variable is percent surface fluctuation of the deposited layer on the substrate, and the X-variable is substrate radius in dm.

Thus, there is need for improvements in sputtering targets in order to more evenly erode the target while having positive uniformity and efficiency characteristics.

BRIEF DESCRIPTION OF THE INVENTION

The following summary presents a simplified summary in order to provide a basic understanding of some aspects of the systems and/or methods discussed herein. This summary is not an extensive overview of the systems and/or methods discussed herein. It is not intended to identify key/critical elements or to delineate the scope of such systems and/or methods. Its sole purpose is to present some concepts in a simplified form as a prelude to the more detailed description that is presented later.

In accordance with one aspect, the present invention provides a target for a physical vapor deposition system. The target includes a base with a center and a rim, an inner ring extending from the base, and an outer ring extending from the base.

In accordance with another aspect, the present invention provides a sputter chamber. The sputter chamber includes an enclosure, a substrate support member, a sputter target that faces the substrate support member within the enclosure, and a magnetron. The sputter target has a base, an inner ring extending from the base, and an outer ring extending from the base.

In accordance with still another aspect, the present invention provides a target for a physical vapor deposition system. The target includes a top, a bottom, and a sloped edge connecting the top and the bottom. The sloped edge has a first portion extending from the top a first vertical distance. The first portion and the top define a first obtuse angle. The sloped edge also has a second portion extending from the first portion a second vertical distance. The second portion and the top define a second obtuse angle. The first vertical distance is greater than the second vertical distance.

BRIEF DESCRIPTION OF THE DRAWINGS

The foregoing and other aspects of the invention will become apparent to those skilled in the art to which the invention relates upon reading the following description with reference to the accompanying drawings, in which:

FIG. 7b is a cross section of the target in FIG. 7a;

FIG. 7d is a table of the specific dimensions of the target in FIGS. 7a-7c;

FIG. 8b is a uniformity profile for the targets in FIG. 8a;

FIG. 11b is an enlarged view of the right half of this cross-section of FIG. 11a;

FIG. 12 is a schematic illustration of emission characteristics for the target in FIG. 11a;

FIG. 14b is an enlarged view of the cross section of FIG. 14a.

DETAILED DESCRIPTION OF THE INVENTION

Figure 1:
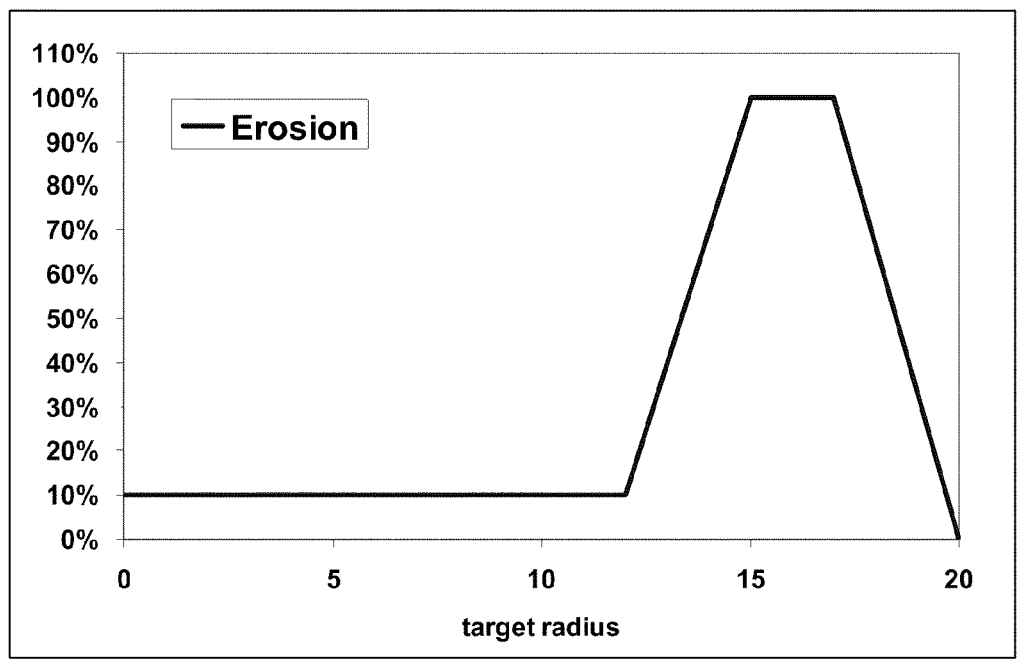
FIG. 1 is a sputtering erosion profile of a prior art target.
Figure 2:
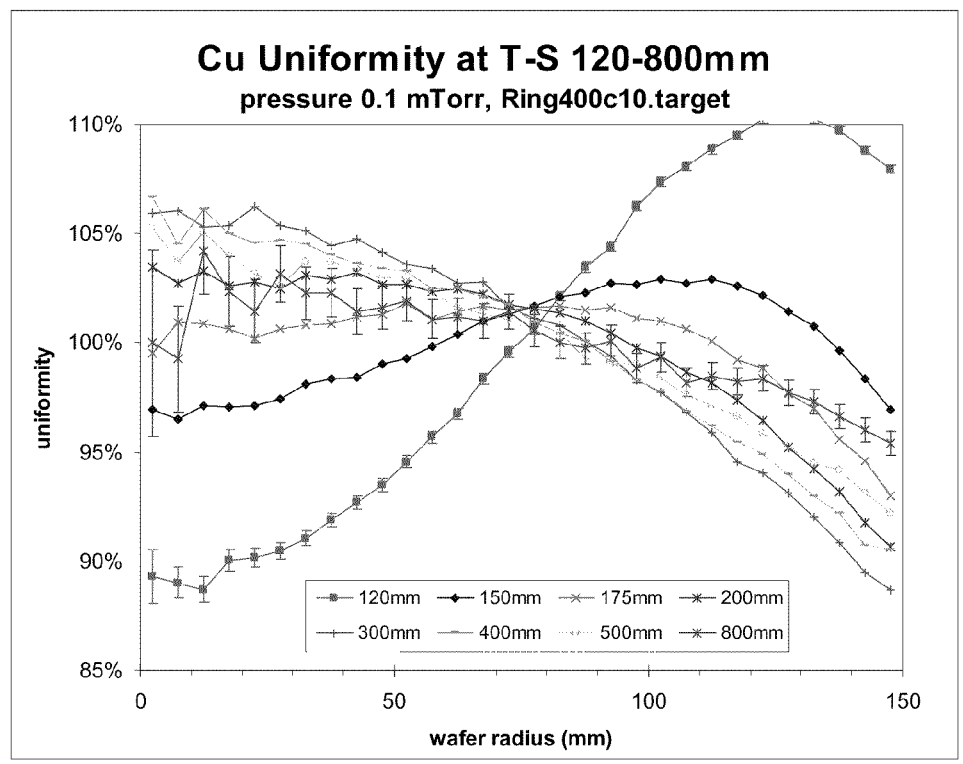
FIG. 2 is a deposition uniformity profile for the prior art target.
Figure 3:
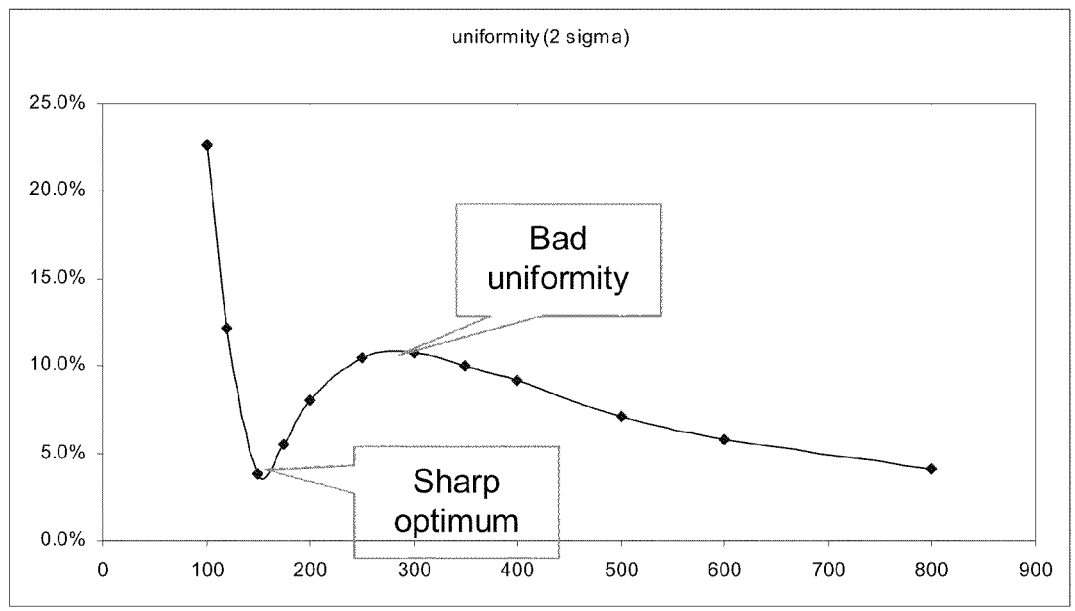
FIG. 3 is a uniformity profile similar to FIG. 2, but plotted as a function of TSD.
Figure 4:
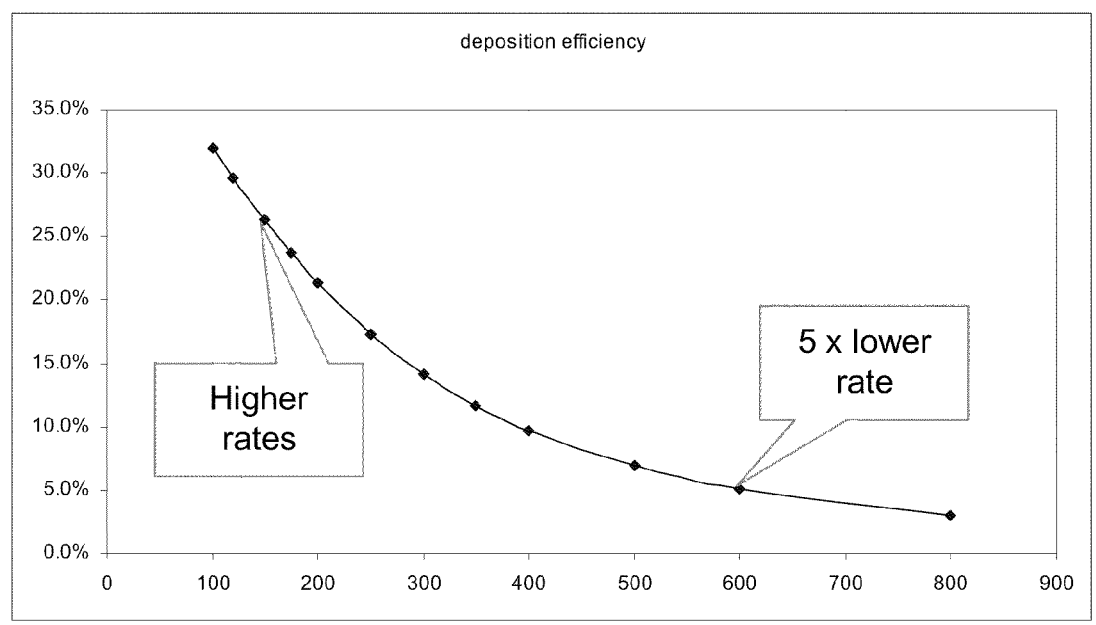
FIG. 4 is a graph of sputtering efficiency for a prior art target.
Figure 5:
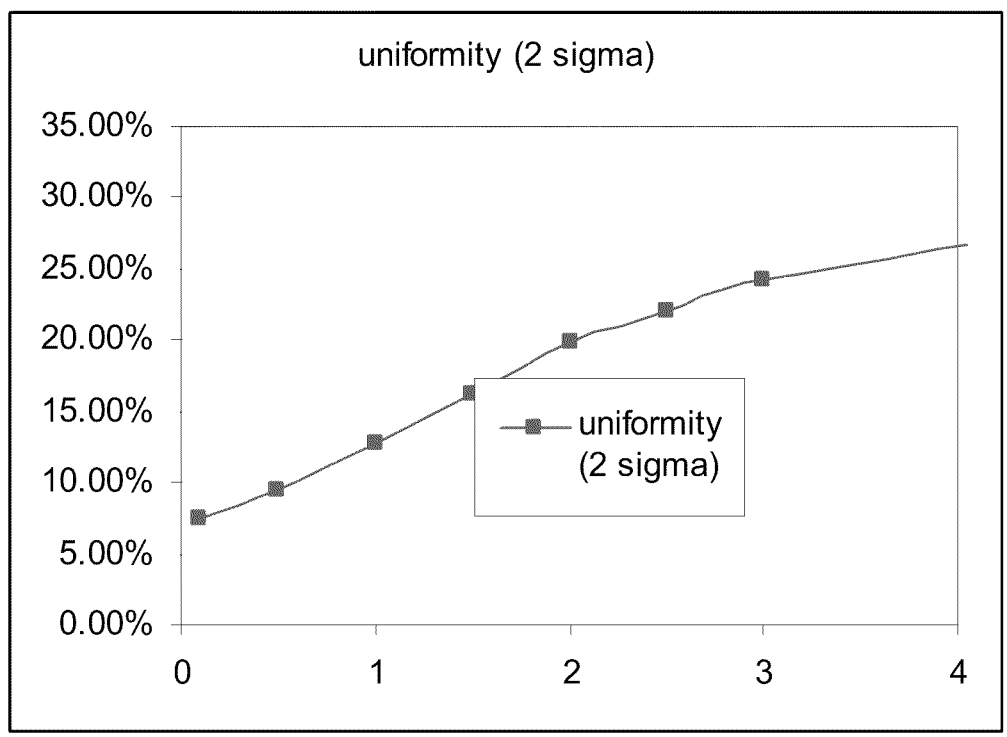
FIG. 5 is a uniformity profile similar to FIG. 2, but calculated at a higher pressure.

Example embodiments that incorporate one or more aspects are not intended to be overall limitations on the invention. For example, one or more aspects of the invention can be utilized in other embodiments and even other types of devices. Moreover, certain terminology is used herein for convenience only and is not to be taken as a limitation on the invention. Still further, in the drawings, the same reference numerals are employed for designating the same elements.

Figure 6:
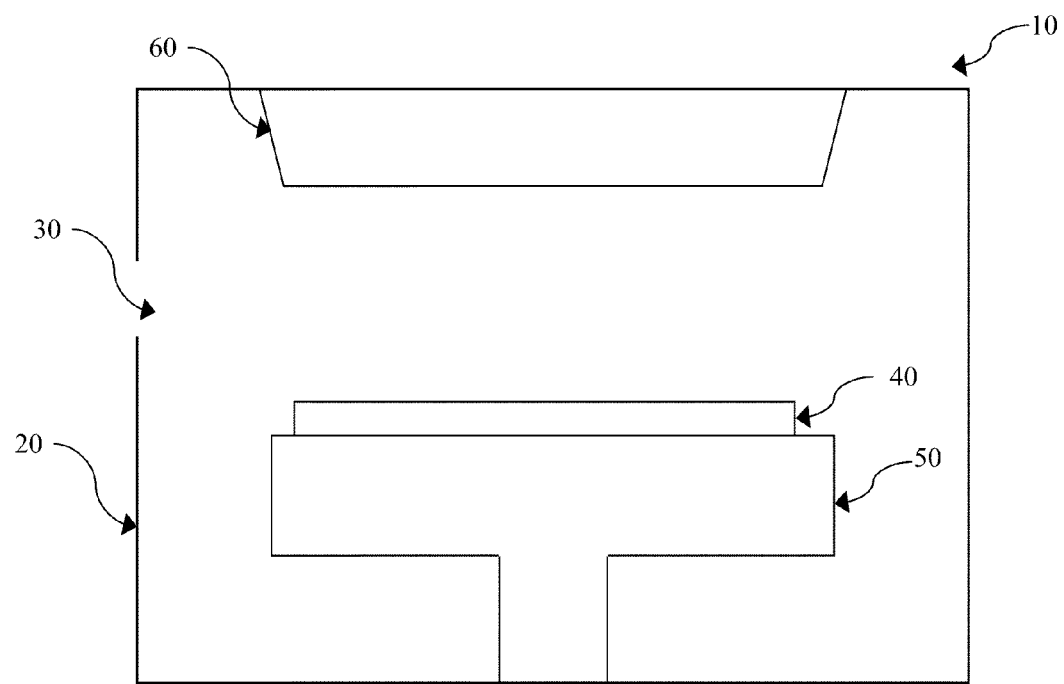
FIG. 6 is a schematic illustration of a sputtering chamber.

FIG. 6 schematically illustrates an example sputtering chamber 10 according to one aspect of the invention. The sputtering chamber 10 includes a chamber enclosure wall 20 having at least one gas inlet 30. A substrate 40 and substrate support pedestal 50 are disposed at the lower end of the chamber, and a target 60 is received at the upper end of the chamber.

Figure 7A:
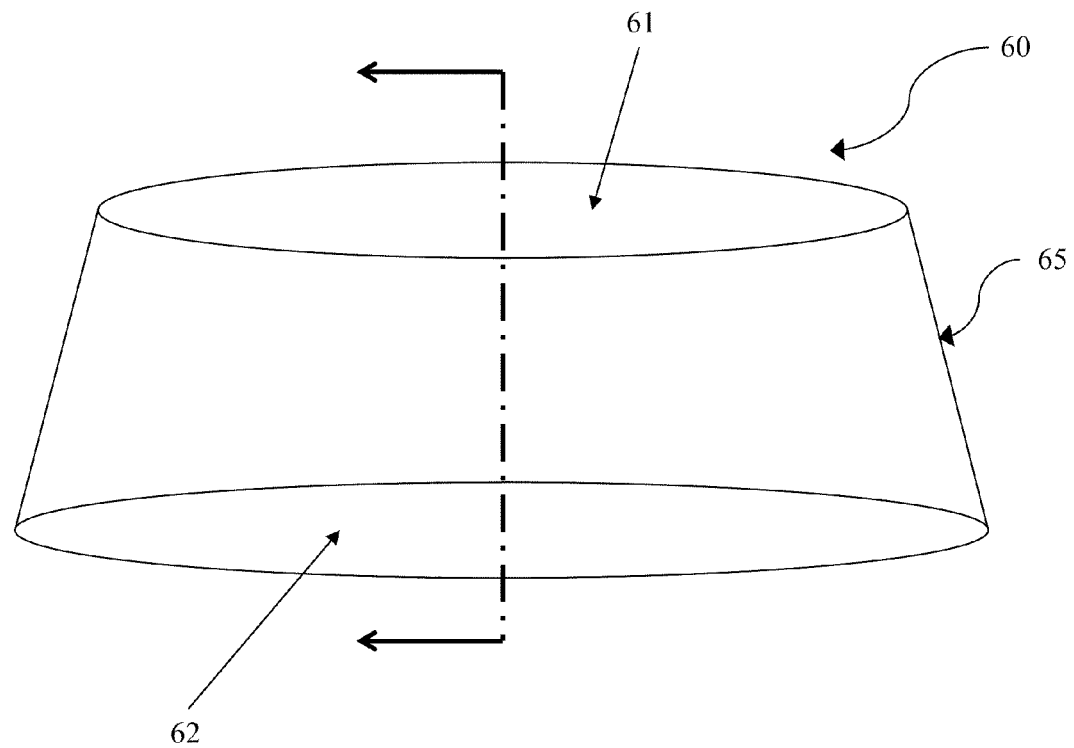
FIG. 7a is a prospective view of a target according to one aspect of the present invention.

FIG. 7a illustrates a simplified perspective view of target 60 according to a first embodiment of the present invention. It should be appreciated that the target in this view (and subsequent views except FIGS. 9 and 12) is inverted compared to FIG. 6. The target is generally disk-shaped with sloped outer edges, such that it is in the shape of a truncated cone or conical frustum. The target has a top or substrate side 61 and a bottom or wall side 62. The sloped area or "mantle" 65 connects the top 61 and the bottom 62, and is where the main erosion takes places.

Figure 7B:
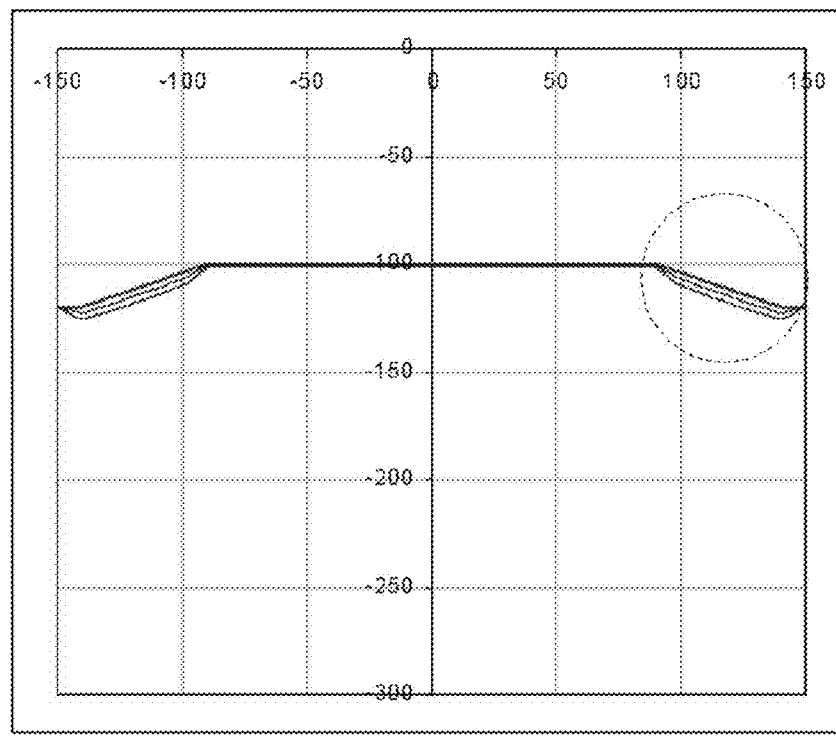

FIG. 7b is a cross section of target 60. In FIG. 7b, the top line is the initial cross section of the target, and the subsequent lines represent the cross section after erosion due to sputtering. The Y-variable is target distance from the substrate in mm, and the X-variable is target radius to a point on the target in mm. As will be discussed in detail below, the target's specific mantle shape results in the best uniformity of material on the substrate at a high deposition rate.

Figure 7C:
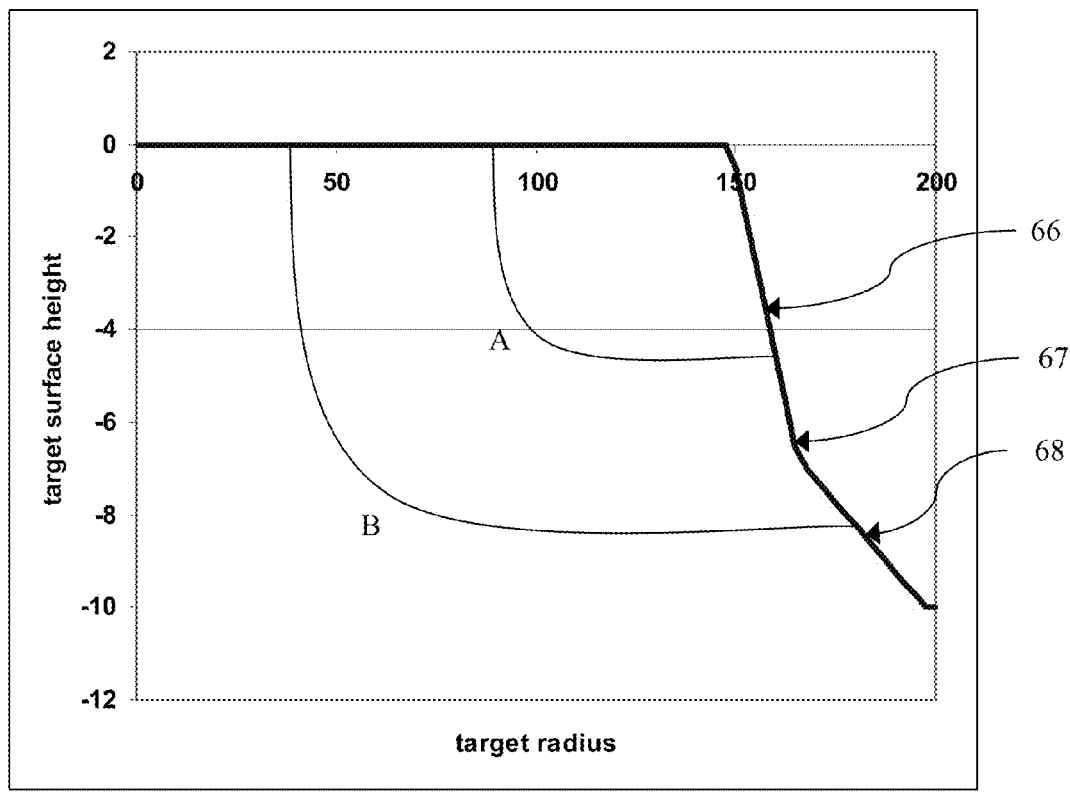
FIG. 7c is an enlarged view of the target in FIGS. 7a and 7b.

In FIG. 7c, an enlarged view of the cross section of FIG. 7b is depicted. As in FIG. 7b, the Y-variable is target surface height, with reference to the top surface, in mm, and the X-variable is target radius in mm. The mantle has a height of 10 mm, which is 1/20 or 5% of the target radius, and comprises two sloped sections. A first section 66 is closest to the target's center and sloped at a first angle A. At a location 67 between a surface height of 6 mm and 7 mm, a second section 68 begins. The second section 68 is sloped at a second angle B, and the second angle B is greater than the first angle A. The first section 66 has a steep slope, and the second section 68 has a less steep slope. The transition from the top of the target to sloped section 66 is rounded, as is the transition from sloped section 66 to sloped section 68.

The specific dimensions of the target are indicated in the table of FIG. 7d.

Figure 8A:
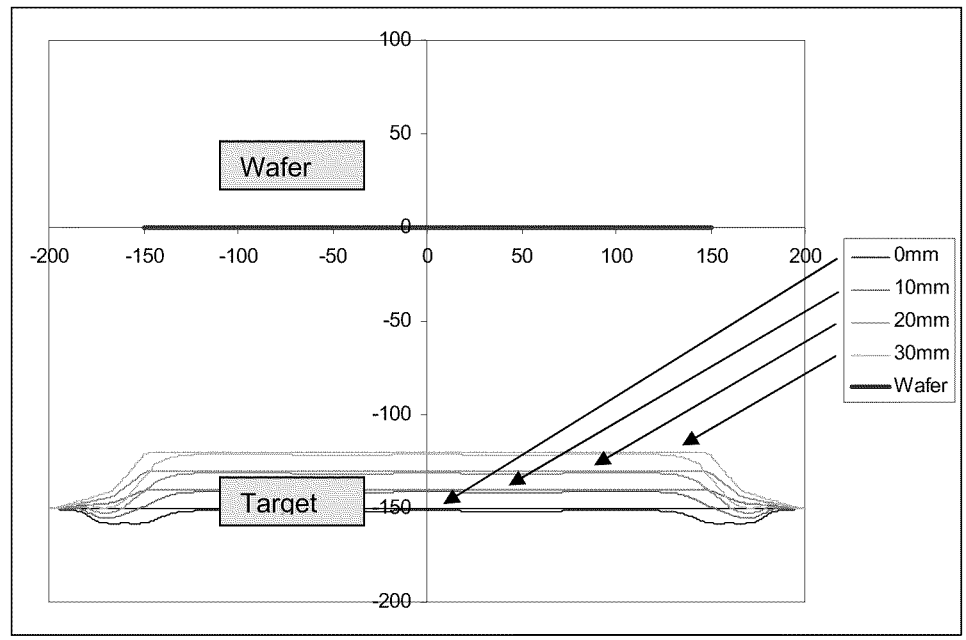
FIG. 8a is cross sections of targets with different sloped profiles.

The basis for the target shape will now be described. FIG. 8a illustrates targets with differently sloped mantles and their corresponding idealized erosion profiles. The measurements of 0 mm to 30 mm refer to the target surface height, which is the vertical distance from the top to the bottom of the mantle. A target with a 30 mm surface height has the steepest slope, and a target with a 0 mm surface height has the least steep slope because it is a flat disk. Similar to FIG.

7*b*, the top line of each target is its initial cross section, and the subsequent lines represent the cross section after erosion due to sputtering. These targets are opposed to a substrate at a distance of 120 to 150 mm.

Figure 8B:
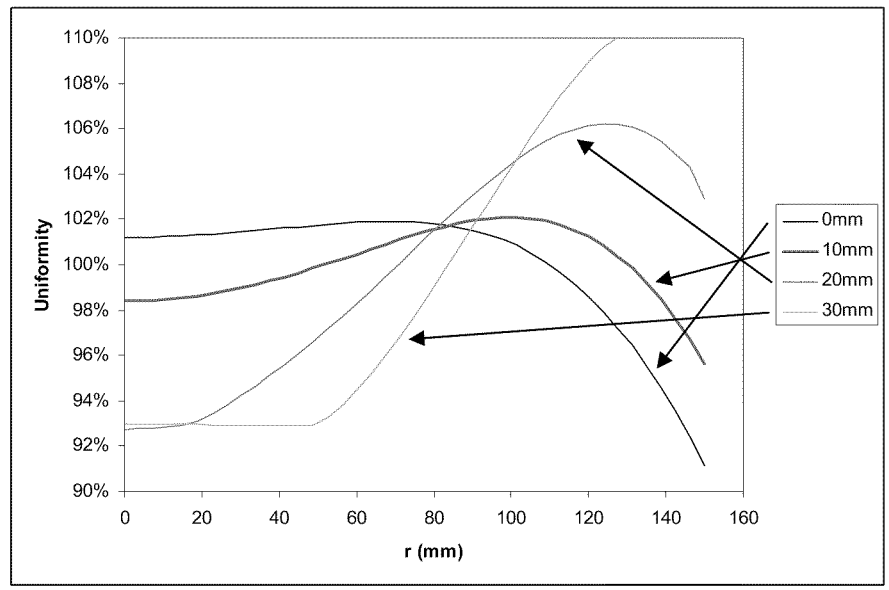

The uniformities resulting from the targets of FIG. 8*a* are plotted in FIG. 8*b*. In FIG. 8*b*, the Y-variable is percent uniformity, and the X-variable is radius of the substrate in mm. An ideal target would have 100% uniformity. The graph shows that profiling the target edge by 10 mm is able to improve uniformity at a substrate radius of 140 mm significantly. As such, the present invention utilizes this dimension.

Figure 8C:
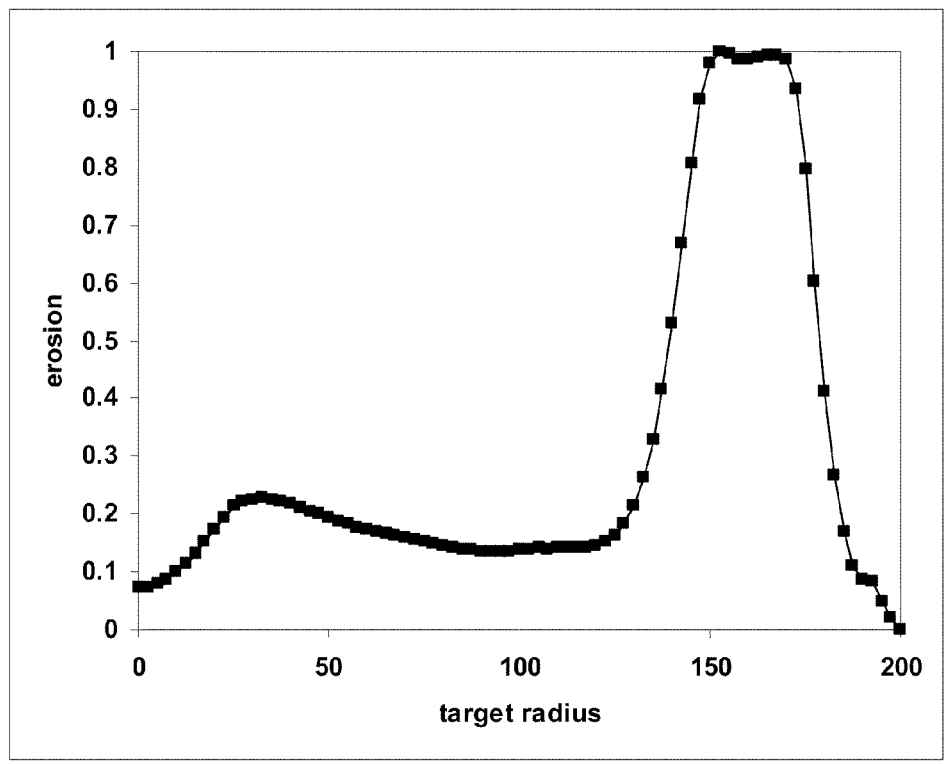
FIG. 8c is an erosion profile of the target of FIGS. 7a-7c.

FIG. 8*c* depicts the erosion profile of target 60. The Y-variable is erosion of the target center area in mm, and the X-variable is target radius at a point on the target in mm. As in FIG. 1, there is increased erosion near the target edge. While the corresponding magnet is optimized to erode mainly near the edge, some erosion of 10 to 20% is actually beneficial to keep the target clean in the center area.

Figure 9:
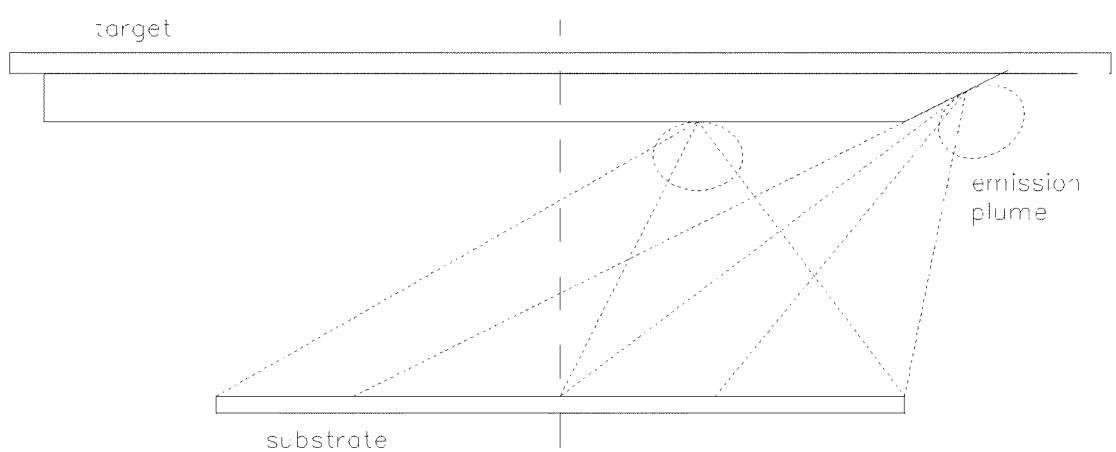
FIG. 9 is a schematic illustration of emission characteristics for the target of FIGS. 7a-7c.

The operation of the target of the present invention will now be described with reference to FIG. 9. The emission characteristics of the sputtered particles are often cosine or somewhat broader than cosine, $$f(\theta)=\cos^n \theta$$

where the exponent n describes the directionality of the emission. Values of n from 0.5 to 1.0 are often reported for experimental emission characteristics. The emission characteristics are sketched as an ellipse in FIG. 9.

For a flat target, emissions from the target can reach anywhere on the substrate. Emissions near the target edge will largely deposit on the nearest substrate locations across from the edge. However, at a reduced rated, the edge emissions will deposit near the center of the substrate. Some edge emissions may deposit at distal edge locations of the substrate, but the rate is extremely reduced due to quadratic decrease with distance, combined with high angles of emission and incidence.

These deposition properties change with a sloped target edge. As with a flat target, emission from the target edge contributes to deposition across from the edge. However, deposition on the opposite side of the wafer is zero due to shadowing. Even deposition to the central locations of the wafer is reduced, due to high emission angles. Detailed calculations show that decrease of the deposition rate in central locations of the substrate may be more pronounced than on the substrate edge, resulting in improved film uniformity.

Figure 10:
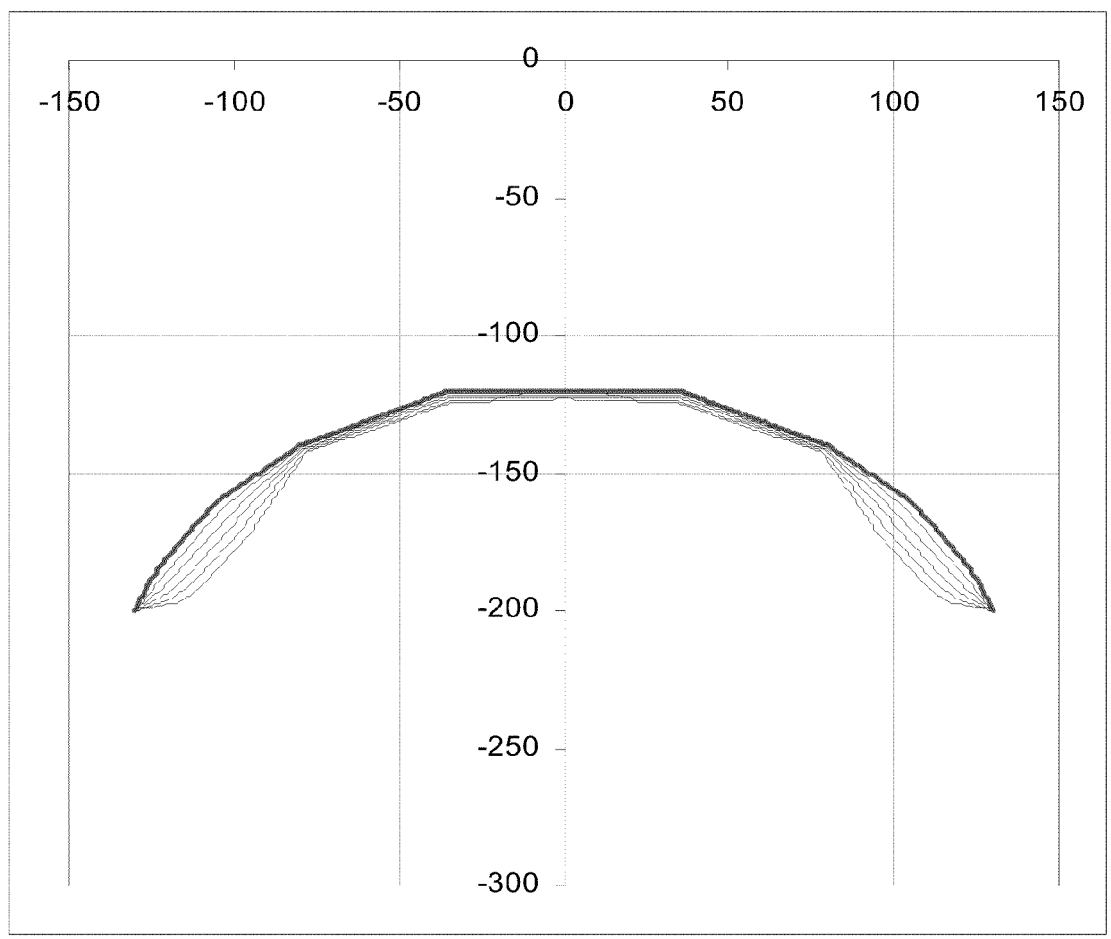
FIG. 10 is a cross section of a target according to another aspect of the present invention.

FIG. 10 illustrates a second embodiment of a target according to the present invention. FIG. 10 is a cross-section of the target, which is similar in shape to a hollow dome or an upturned bowl. The top line is the initial cross section of the target, and the subsequent lines represent the cross section after erosion. The Y-variable is target distance from the substrate in mm, and the X-variable is target radius to a point on the target in mm. Similar to the truncated cone target, the dome-shaped target has several sloped sections. Because the sloped sections in this embodiment are larger and more plentiful, there is more shadowing than in FIG. 9. This results in an even more uniform deposition of sputtered material on the substrate.

The dome-shaped target of FIG. 10 requires an arrangement of magnets in three dimensions. In comparison, the truncated cone target only requires magnets in two dimensions. In addition, the dome-shaped target may be more difficult to manufacture, leading to higher costs.

Figure 11A:
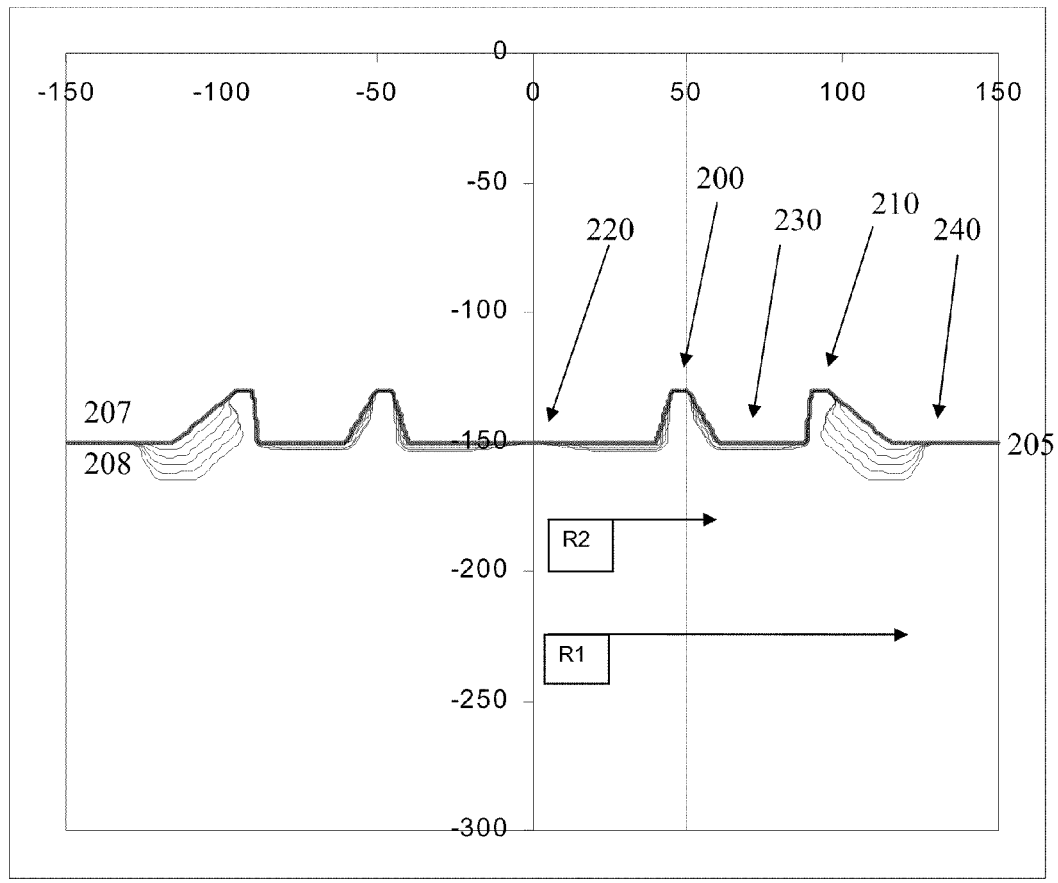
FIG. 11a is a cross section of a target according to still another aspect of the present invention.
Figure 11B:
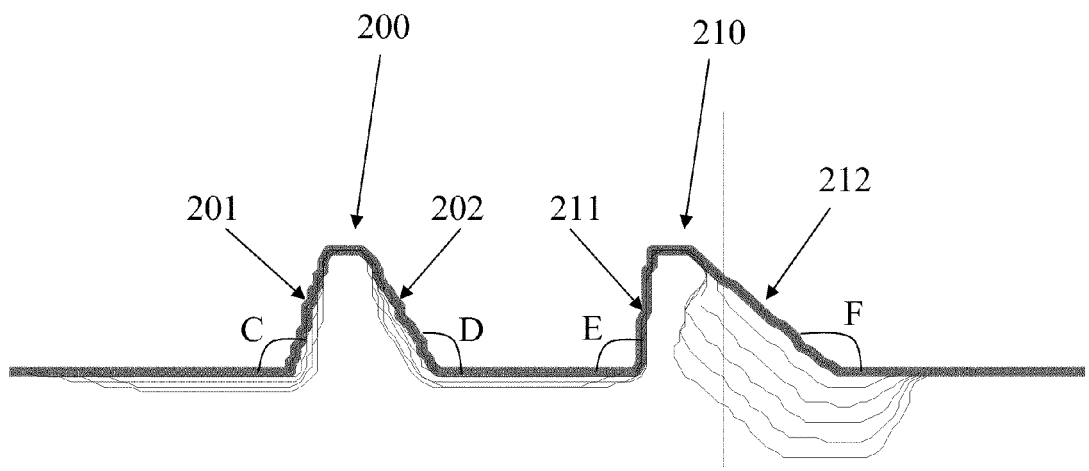

FIG. 11*a* illustrates a third embodiment of a target according to the present invention. FIG. 11*a* is a cross-section of the target, and FIG. 11*b* is an enlarged view of the right half of this cross-section. As in FIG. 10, the top line is the initial cross section of the target, and the subsequent lines represent the cross section after erosion. The Y-variable is target distance from the substrate in mm, and the X-variable is target radius to a point on the target in mm. The target has concentric rings with sloped sidewalls directing outwards, and is similar in shape to a Fresnel lens. 207 denotes the surface side of the target, whereas 208 is the material (bulk) side of the target. Reference numeral 205 refers to a reference plane or base of the target, independent of any surface structure of the target. A first ring 200 and a second ring 210 are concentric and the same height. A first groove 220 is formed inside the first ring 200, and a second groove 230 is formed between the first ring 200 and the second ring 210. A flat rim 240 is formed around the edge of the target.

The first ring 200 has a first side 201 sloped at an angle C from the bottom of groove 220. The first ring 200 also has a second side 202 sloped at an angle D from the bottom of groove 230. Angle D is slightly larger than angle E.

Similarly, the second ring 210 has a first side 211 sloped at an angle E from the bottom of groove 220. The second ring 210 also has a second side 212 sloped at an angle F from rim 240. Angle F is larger than angles C, D, and E. Accordingly, angle E is smaller than angles C and D. Angles C-F are all 90 degrees or greater.

Figure 12:
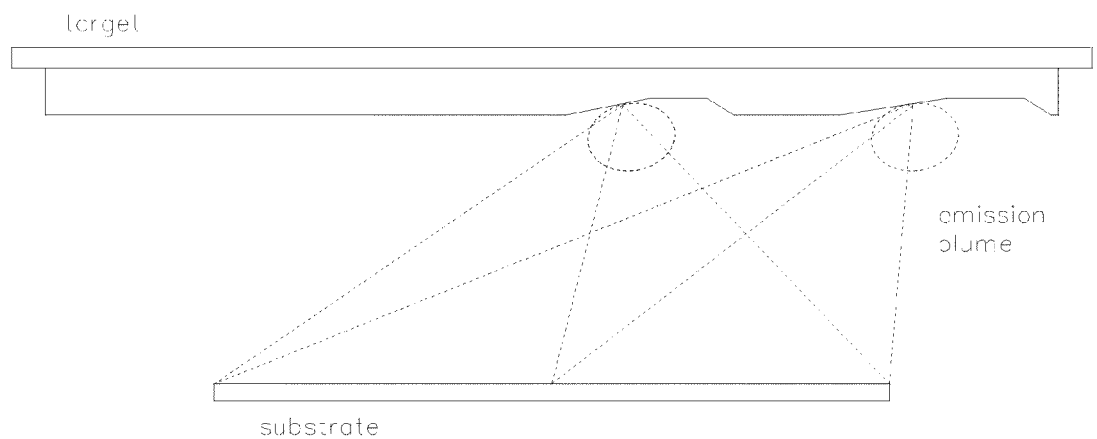

FIG. 12 is a schematic illustration of emission characteristics for the target in FIGS. 11*a* and 11*b*. As in FIG. 9 which depicts the emission characteristics of the truncated cone target, there is shadowing from the sloped regions. However, because there are more sloped regions in this embodiment, there is more shadowing.

Figure 13A:
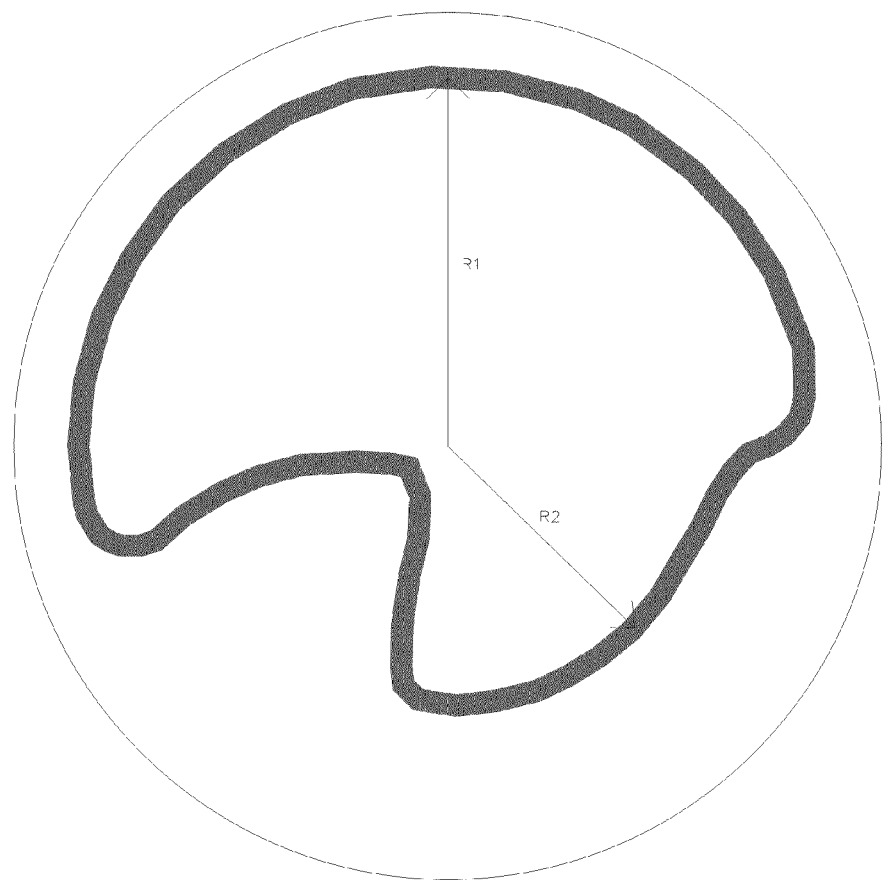
FIG. 13a is an erosion track for the target in FIGS. 11a and 11b.

FIG. 13*a* depicts an example erosion track design for the Fresnel lens target embodiment of FIGS. 11*a* and 11*b*. A rotating magnet arrangement follows the closed erosion track. The main erosion has to be concentrated underneath the sloped sidewalls in order to benefit from an emission facing outwards (FIG. 12). The erosion is held primarily on the radii R1 and R2, wherein R1 corresponds to the radius of the first ring 200 and R2 corresponds to the radius of the second ring 210. The erosion has to jump between these partial concentric tracks and streak the center part of the target in order to decrease re-deposition.

Figure 13B:
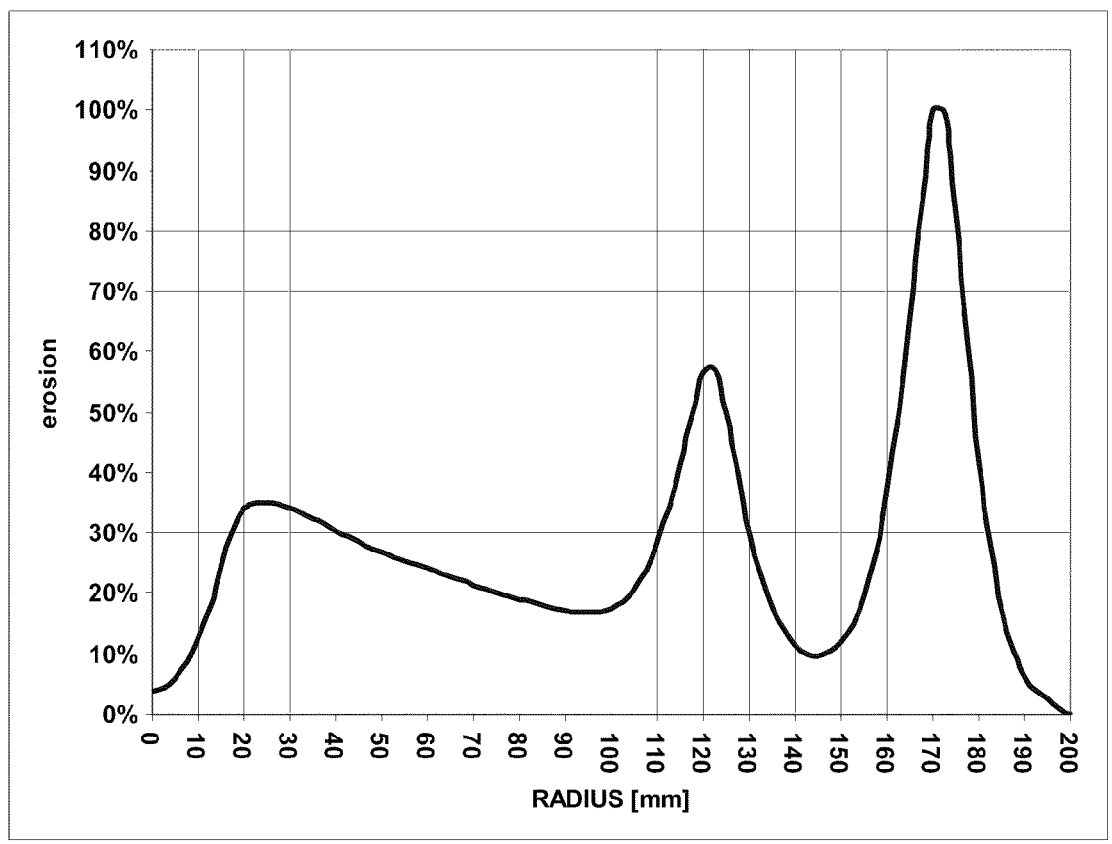
FIG. 13b is an erosion profile of the target in FIGS. 11a and 11b.

FIG. 13*b* depicts an erosion profile for the Fresnel lens target of FIG. 11*a*. The Y-variable is percent erosion, and the X-variable is target radius at a point on the target in mm. The percent erosion reaches three peaks corresponding to erosion racetracks, with the greatest between a target radius of 170 and 180 mm.

Figure 14A:
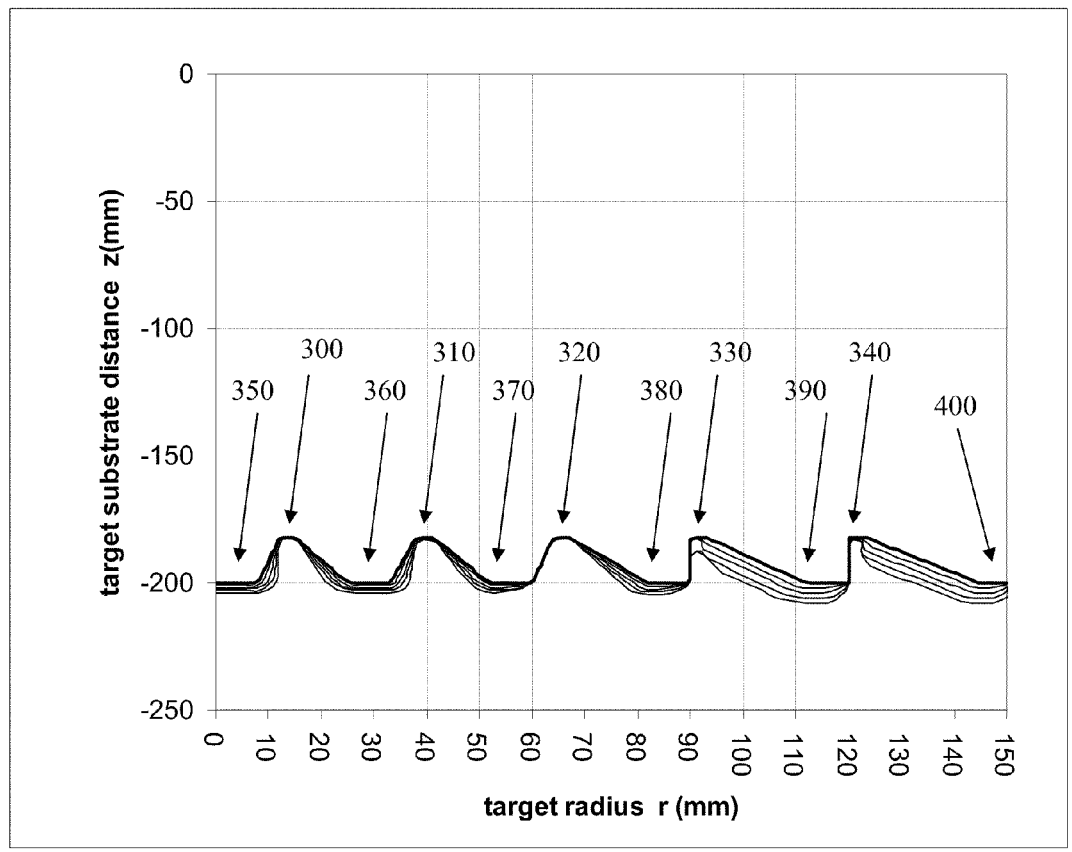
FIG. 14a is a cross section of a target according to yet another aspect of the present invention.
Figure 14B:
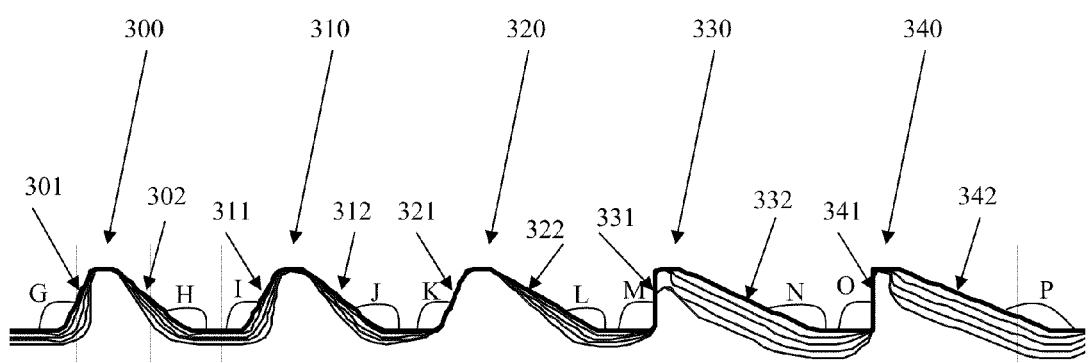

FIG. 14*a* illustrates a fourth embodiment of a target according to the present invention. FIG. 14*a* is a cross-section of the target from the radius to the rim, and FIG. 14*b* is an enlarged view of this cross-section. As in the previous figures, the top line is the initial cross section of the target, and the subsequent lines represent the cross section after erosion. The Y-variable is target distance from the substrate in mm, and the X-variable is target radius to a point on the target in mm. Similar to the third embodiment, the target of the fourth embodiment has concentric rings with sloped sidewalls directing outwards, and is similar in shape to a Fresnel lens. A first ring 300, a second ring 310, a third ring 320, a fourth ring 330, and a fifth ring 340 are concentric and the same height. A first groove 350 is formed inside the first ring 300, a second groove 360 is formed between the first ring 300 and the second ring 310, a third groove 370 is formed between the second ring 310 and the third ring 320, a fourth groove 380 is formed between the third ring 320 and the fourth ring 330, and a fifth groove 390 is formed between the fourth ring 330 and the fifth ring 340. A rim 400 is formed around the edge of the target.

The first ring 300 has a first side 301 sloped at an angle G from the bottom of groove 350. The first ring 300 also has a second side 302 sloped at an angle H from the bottom of groove 360. Angle H is larger than angle G.

The second ring 310 has a first side 311 sloped at an angle I from the bottom of groove 360. The second ring 310 also has a second side 312 sloped at an angle J from groove 370. Angle J is larger than angle I.

The third ring 320 has a first side 321 sloped at an angle K from the bottom of groove 370. The third ring 320 also has a second side 322 sloped at an angle L from groove 380. Angle L is larger than angle K.

The fourth ring 330 has a first side 331 sloped at an angle M from the bottom of groove 380. The fourth ring 330 also has a second side 332 sloped at an angle N from groove 390. Angle N is larger than angle M.

The fifth ring 340 has a first side 341 sloped at an angle O from the bottom of groove 390. The fifth ring 340 also has a second side 342 sloped at an angle P from rim 400. Angle P is larger than angle O.

Overall, angle O is the smallest and angle P is the largest. The angles on the center-facing side of each ring decrease from the center of the target, i.e. angle G of first ring 300, toward the rim of the target, i.e. angle O of fifth ring 340. As such, angle G is larger than angle I, angle I is larger than angle K, angle K is larger than angle M, and angle M is larger than angle O. Similarly, the angles on the rim-facing side of each ring increase from the center of the target, i.e. angle H of first ring 300, toward the rim of the target, i.e. angle P of fifth ring 340. As such, angle H is smaller than angle J, angle J is smaller than angle L, angle L is smaller than angle N, and angle N is smaller than angle P. Angles G-P are all 90 degrees or greater.

Figure 15:
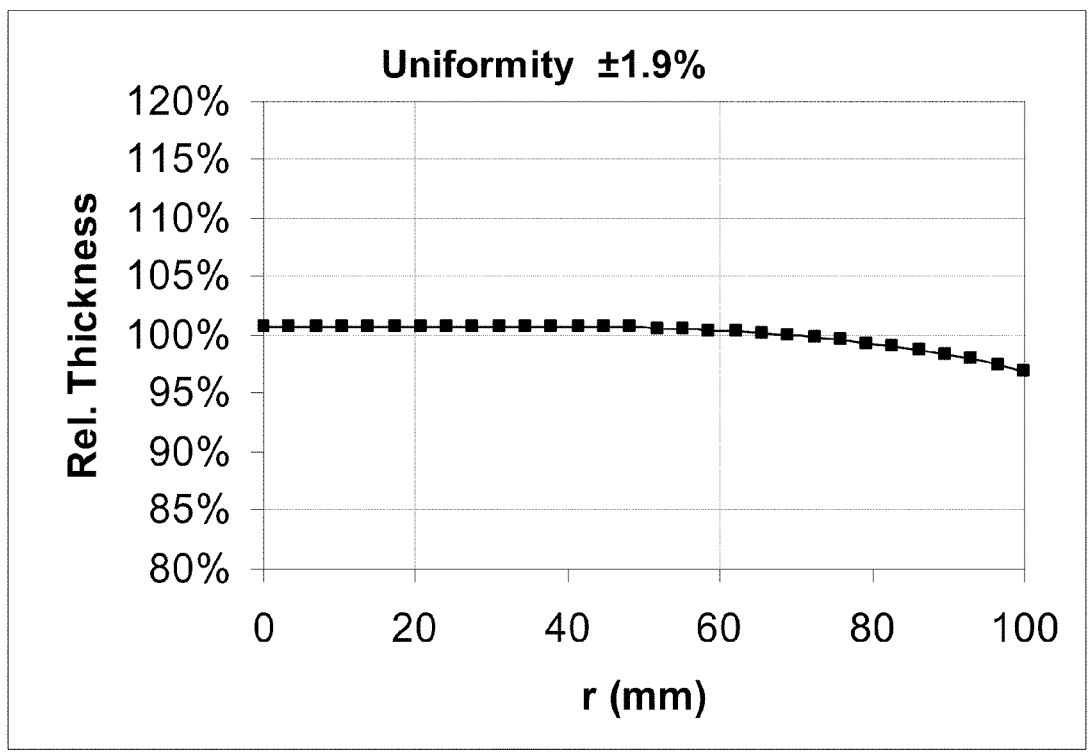
FIG. 15 is a uniformity profile for the target in FIGS. 14a and 14b.

For the embodiment depicted in FIGS. 14a and b, FIG. 15 plots uniformity of the layer deposited on the substrate at a TSD of 200 mm. The Y-variable is percent uniformity of the layer, and the X-variable is substrate radius in mm. The film is almost completely uniform on the entire substrate, and only tapers off slightly toward the edge of the substrate.

What is claimed is:

1. A target for a physical vapor deposition system, the target comprising:
   a base (205) with a center and a rim (240);
   an inner ring (200) extending from the base (205) with an inner side (201) and an outer side (202), the inner side (201) of the inner ring (200) and the base (205) defining a first obtuse angle (C) opening toward the center of the base, the outer side (202) of the inner ring (200) and the base (205) defining a second obtuse angle (D) opening toward the rim (204) of the base (205); and
   an outer ring (210) extending from the base (205) with an inner side (211) and an outer side (212), the inner side (211) of the outer ring (210) and the base (205) defining a third obtuse angle (E) opening toward the center of the base (205), the outer side (212) of the outer ring (210) and the base (205) defining a fourth obtuse angle (F) opening toward the rim (240) of the base (205),
   wherein the inner ring (200) and the outer ring (210) are concentric,
   wherein the fourth angle (F) is greater than the second angle (D), and
   wherein the second angle (D) is greater than the third angle (E).

2. The target of claim 1, wherein the second angle (D) is greater than the first angle (C).

3. The target of claim 1, wherein the fourth angle (F) is greater than the third angle (E).

4. The target of claim 1, wherein the outer side (212) of the outer ring (210) has a length that is greater than the inner side (211) of the outer ring (210).

5. The target of claim 1, wherein a greater amount of erosion from sputtering is configured to occur on the outer side (212) of the outer ring (210) than the inner side (211) of the outer ring (210).

6. A sputter chamber comprising:
   an enclosure;
   a substrate support member;
   a sputter target facing the substrate support member within the enclosure, the target having a base (205), an inner ring (200), and an outer ring (210), the base (205) having a center and a rim (240), the inner ring (200) extending from the base (205) with an inner side (201) and an outer side (202), the inner side (201) of the inner ring (200) and the base (205) defining a first obtuse angle (C) opening toward the center of the base (205), the outer side (202) of the inner ring (200) and the base (205) defining a second obtuse angle (D) opening toward the rim (240) of the base (205), the outer ring (210) extending from the base (205) with an inner side (211) and an outer side (212), the inner side (211) of the outer ring (210) and the base (205) defining a third obtuse angle (E) opening toward the center of the base (205), the outer side (212) of the outer ring (210) and the base (205) defining a fourth obtuse angle (F) opening toward the rim (240) of the base (205); and
   an array of permanent magnets arranged behind the target, the permanent magnets being configured to establish a closed magnetic tunnel above a surface of the target,
   wherein the inner ring (200) and the outer ring (210) are concentric,
   wherein the fourth angle (F) is greater than the second angle (D), and
   wherein the second angle (D) is greater than the third angle (E).

7. The sputter chamber of claim 6, wherein the magnet arrangement concentrates the magnetic tunnel primarily on radii R1 and R2, wherein R1 corresponds to the radius of the inner ring (200) and R2 corresponds to the radius of the outer ring (210).

8. The target of claim 1, wherein a greater amount of erosion from sputtering is configured to occur on the outer side (212) of the outer ring (210) than the outer side (202) of the inner ring (200).

9. The target of claim 1, wherein the second angle (D) is greater than the first angle (C),
   wherein the fourth angle (F) is greater than the third angle (E),
   wherein the outer side (212) of the outer ring (210) has a length that is greater than the inner side (211) of the outer ring (210),
   wherein a greater amount of erosion from sputtering occurs on the outer side (212) of the outer ring (210) than the inner side (211) of the outer ring (210), and
   wherein a greater amount of erosion from sputtering occurs on the outer side (212) of the outer ring (210) than the outer side (202) of the inner ring (200).

10. The sputter chamber of claim 7, wherein the second angle (D) is greater than the first angle (C),
    wherein the fourth angle (F) is greater than the third angle (E), wherein the outer side (212) of the outer ring (210) has a length that is greater than the inner side (211) of the outer ring (210), wherein a greater amount of erosion from sputtering occurs on the outer side (212) of the outer ring (210) than the inner side (211) of the outer ring (210), and wherein a greater amount of erosion from sputtering occurs on the outer side (212) of the outer ring (210) than the outer side (202) of the inner ring (200).

\* \* \* \* \*